United States Patent
Randolph et al.

(10) Patent No.: US 6,906,959 B2
(45) Date of Patent: Jun. 14, 2005

(54) METHOD AND SYSTEM FOR ERASING A NITRIDE MEMORY DEVICE

(75) Inventors: Mark W. Randolph, San Jose, CA (US); Chi Chang, Redwood City, CA (US); Yi He, Sunnyvale, CA (US); Wei Zheng, Santa Clara, CA (US); Edward F. Runnion, Santa Clara, CA (US); Zhizheng Liu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/306,252

(22) Filed: Nov. 27, 2002

(65) Prior Publication Data

US 2004/0169218 A1 Sep. 2, 2004

(51) Int. Cl.[7] .............................................. G11C 16/04
(52) U.S. Cl. .................................. 365/185.29; 365/218
(58) Field of Search ......... 365/94–105, 185.29–185.33; 257/314, 324–326, 410, 411; 438/287, 288, 414, 954

(56) References Cited

U.S. PATENT DOCUMENTS

| | | | | |
|---|---|---|---|---|
| 5,243,559 A | * | 9/1993 | Murai .................... | 365/185.27 |
| 5,576,995 A | * | 11/1996 | Sato et al. ............. | 365/185.27 |
| 5,907,171 A | | 5/1999 | Santin et al. ............... | 257/315 |
| 6,242,774 B1 | * | 6/2001 | Sung .......................... | 257/315 |
| 6,274,422 B1 | | 8/2001 | Wakita ....................... | 438/238 |
| 6,319,775 B1 | * | 11/2001 | Halliyal et al. ............. | 438/261 |
| 6,461,949 B1 | * | 10/2002 | Chang et al. ............... | 438/585 |
| 6,528,845 B1 | * | 3/2003 | Bude et al. ................. | 257/324 |

FOREIGN PATENT DOCUMENTS

JP     2002 043448     6/2002

OTHER PUBLICATIONS

Jaeger; Introduction to Microelectronic Fabrication, Modular Series on Solid State Devices, vol. V; 1993, Addison–Wesley Publishing Company, pp. 79,82.*

Morris, S.J. et al.: "Modeling of Boron, Phosphorus, and Arsenic Implants into Single–Crystal Silicon over a Wide Energy Range (Few KeV to Several MeV)" Electron Devices Meeting, 1996., International San Francisco, CA, USA, IEEE, US, Dec. 8, 1996, pp. 721–724, XP010207643 ISBN 0–7803–3393–4.

* cited by examiner

*Primary Examiner*—Howard Weiss
*Assistant Examiner*—Marcos D. Pizarro-Crespo (57) ABSTRACT

The present invention is a method and system for erasing a nitride memory device. In one embodiment of the present invention, an isolated P-well is formed in a semiconductor substrate. A plurality of N-type impurity concentrations are formed in the isolated P-well and a nitride memory cell is fabricated between two of the N-type impurity concentrations. Finally, an electrical contact is coupled to the isolated P-well.

8 Claims, 9 Drawing Sheets

METHOD AND SYSTEM FOR ERASING A NITRIDE MEMORY DEVICE

FIELD OF THE INVENTION

The present invention pertains to the field of semiconductor devices. More specifically, embodiments of the present invention are directed to a method and system for erasing memory devices.

BACKGROUND OF THE INVENTION

Flash memory is a type of electronic memory media that can be rewritten and that can hold its content without the consumption of power. Flash memory devices generally have life spans from 100K to 300K write cycles. Unlike dynamic random access memory (DRAM) devices and static random memory (SRAM) devices in which a single byte can be erased, flash memory devices are typically erased and written in fixed multi-bit blocks or sectors. Flash memory technology evolved from electrically erasable read only memory (EEPROM) chip technology, which can be erased in situ. Flash memory devices are less expensive and denser, meaning that flash memory devices can hold more data per unit area. This new category of EEPROMs has emerged as an important non-volatile memory that combines the advantages of erasable programmable read only memory (EPROM) density with EEPROM electrical erasability.

Figure 1:
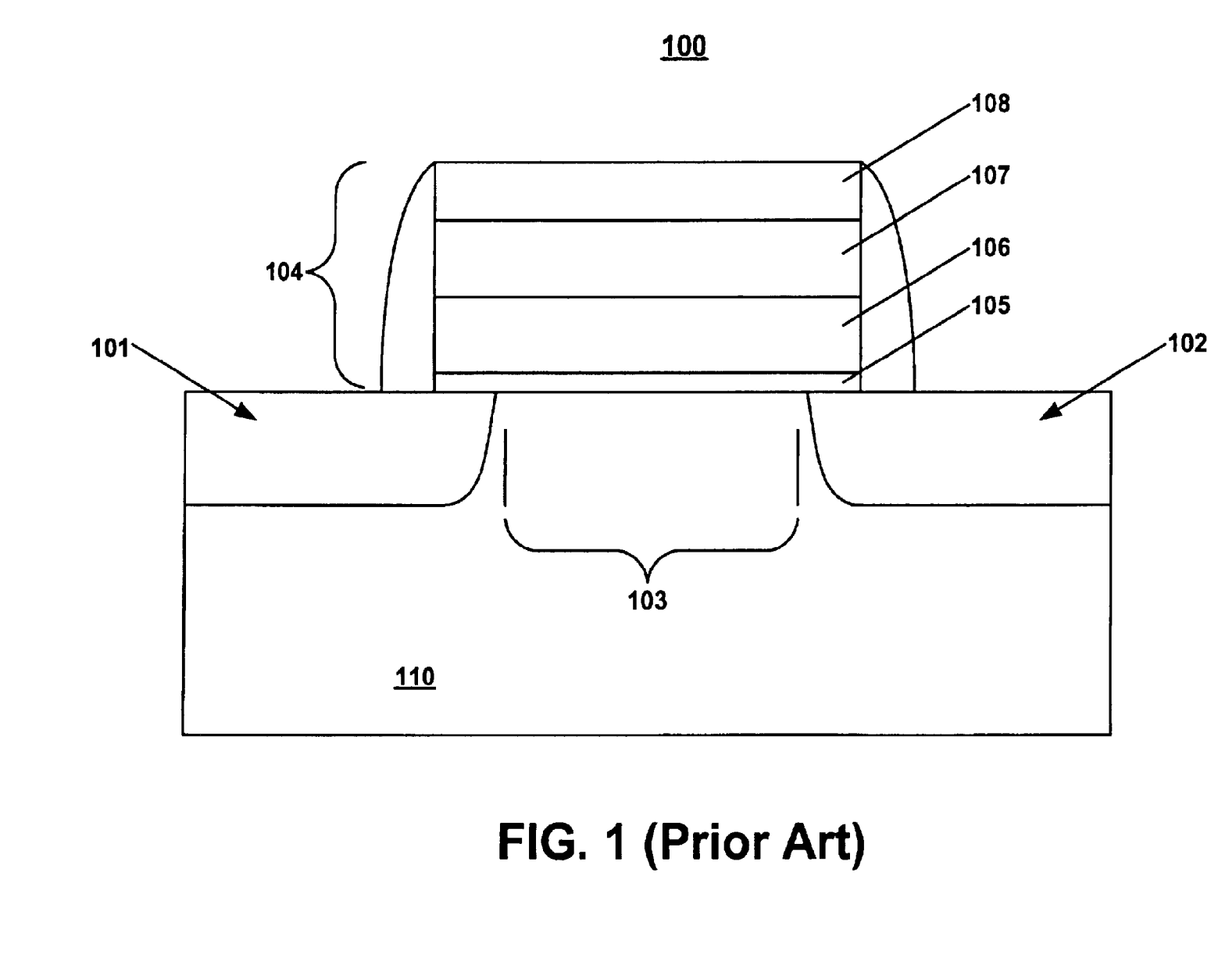
FIG. 1 is a section view of a prior art floating gate memory device.

Conventional flash memory devices are constructed in a cell structure wherein a single bit of information is stored in each cell. FIG. 1 is a cross section view of an exemplary flash memory device. Memory device 100 comprises a metal oxide (MOS) transistor structure having a source 101, a drain 102, and a channel area 103 in a substrate 110, as well as having a stacked gate structure 104 overlying the channel 103. The stacked gate 104 may further include a thin gate dielectric layer 105 (sometimes referred to as a layer of tunnel oxide) formed on the surface of substrate 110. Stacked gate 104 also includes a polysilicon floating gate 106 overlying tunnel oxide 105 and an interpoly dielectric layer 107 overlying floating gate 106. Interpoly dielectric 107 is often a multilayer insulator such as an oxide-nitride-oxide (ONO) layer having two oxide layers sandwiching a nitride layer. Lastly, a polysilicon control gate 108 overlies interpoly dielectric layer 107.

Control gate 108 is coupled with a row of such cells by a common wordline in a typical NOR configuration. In addition, the drain regions 102 of a column of cells are coupled together by a common bitline. When a voltage is applied to control gate 108, an electric field is formed in channel 103 and current can be conducted between source 101 and drain 102. Typically, the source 101 of each cell is coupled to a common source terminal. In operation, individual flash cells are addressed via the respective bitline and wordline using peripheral decoder and control circuitry for programming (writing) reading and erasing the cell.

The single bit stacked gate flash memory cell is typically programmed by "channel hot electron injection" in which a high positive voltage is applied to control gate 108, source 101 is coupled to ground and drain 102 is coupled to a positive voltage. The resulting high electric field across the channel region accelerates electrons toward the drain region and imparts enough energy for them to become hot electrons. The hot electrons are scattered (e.g., by impurities or the substrate lattice structure of the substrate in the channel region) and are redirected toward the floating gate by the vertical field established by the positive control gate voltage. If the electrons have enough energy, they can tunnel through gate oxide 105 into floating gate 106 and become trapped there. This changes the threshold voltage $V_T$, and thereby the channel conductance, of cell 100.

In order to erase a typical single bit stacked gate flash memory cell, a voltage (e.g., 10 to 12 volts) is applied to source 101, control gate 108 is held at a negative potential, and drain 102 is allowed to float. Under these conditions, an electrical field is developed across tunnel oxide 105 between floating gate 106 and source 101. The electrons that are trapped in floating gate 106 flow toward and cluster at the portion of floating gate 106 overlying source region 101. The electrons are then extracted from floating gate 106 and into source region 101 by way of Fowler-Nordheim tunneling through tunnel oxide 105. Cell 100 is erased as the electrons are removed from floating gate 106.

Figure 2:
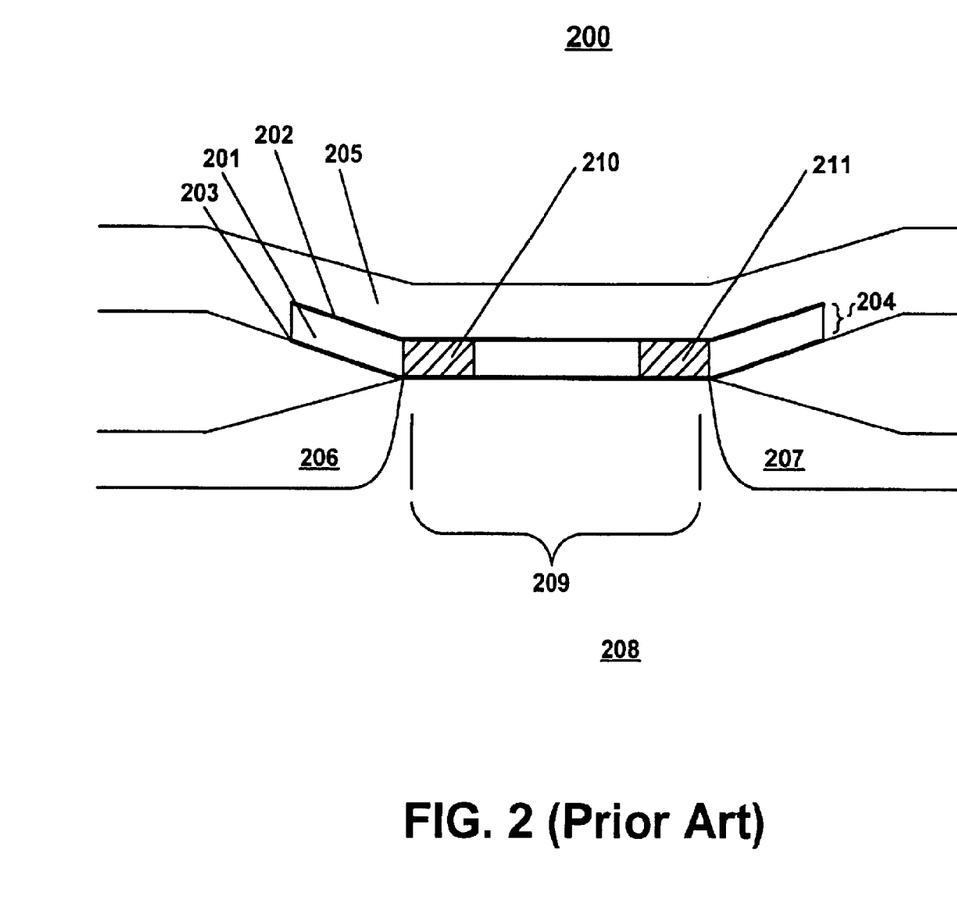
FIG. 2 is a section view of a prior art nitride read only memory device.

More recently, nitride read only memory (NROM) devices (also known as dual bit flash memory) have been introduced that allow the storage of two bits of information in two separate cells of a single memory device. The NROM device uses what is known as a virtual ground architecture in which the source of one cell in the device serves as the drain of the other cell. FIG. 2 illustrates an exemplary prior art nitride read only memory device 200. Memory device 200 comprises a silicon nitride layer 201 which is disposed between a top silicon dioxide layer 202 and a bottom silicon dioxide layer 203, forming an ONO layer 204. A polysilicon layer 205 resides over the ONO layer 204 and acts as a wordline for memory device 200. A first bitline 206 and a second bitline 207 run underneath the ONO layer 204. Memory device 200 resides on P-type substrate 208 with the conductive portion of the bitlines 206 and 207 formed from an N+ implant, such that a channel 209 is formed across the P-type substrate 208 when the bitlines are biased. Memory device 200 is a single transistor having interchangeable source and drain components formed from bitlines 206 and 207 with a gate formed as part of a polysilicon wordline 205.

Silicon nitride layer 201 forms a charge trapping layer. Programming a cell is accomplished by applying appropriate voltages to one of the bitlines which acts as the drain terminal, to the gate (e.g., polysilicon layer 205) and grounding the bitline acting as the source terminal. The voltages generate electrical fields along channel 209 causing electrons to accelerate and jump from substrate layer 208 into silicon nitride layer 201, which is known as hot electron injection. Since the electrons gain the most energy at the drain, these electrons become trapped and remain stored in silicon nitride layer 201 near the ONO/bitline junction. Since the silicon nitride layer 201 is non-conducting, a first charge can be injected into silicon nitride layer 201 near the junction of bitline 206 and ONO layer 204 and stored as left bit 210. Similarly, and a second charge can be injected and stored separately from the first charge in silicon nitride layer 201 near the junction of bitline 207 and ONO layer 204 and stored as right bit 211.

Nitride read only memory device 200 is symmetrical allowing the drain and the source to be interchangeable. Thus, bitline 206 may serve as the drain terminal and bitline 207 may serve as the source terminal when programming left bit 210. Likewise, bitline 207 may serve as the drain terminal and bitline 206 may serve as the source terminal for programming right bit 211.

Erasing nitride read only memory device 200 involves a tunneling enhanced hot hole (TEHH) injection process in which holes are injected into the region of nitride layer where a charge is stored. For example, a negative high voltage is applied to the control gate (e.g., polysilicon layer 205) and a positive high voltage is applied to one or both of the bitlines 206 and 207 which results in holes entering nitride layer 201 where recombination with the stored electrons occurs. However, hot hole injection can cause degradation of oxide layer 203, particularly in the area of the junction of ONO layer 204 and bitlines 206 and 207 after repeated program/erase cycles.

Additionally, it is difficult to control exactly where in nitride layer 201 the electrons and holes are injected. Typically, the electrons of a stored bit (e.g., left bit 210) are believed to be concentrated along the edge of the bitline/ONO junction because the electrons gain the most energy at the drain (e.g., bitline 206 of FIG. 2). However, it is not clearly understood where the greatest concentration of holes occurs when they are injected into nitride layer 201. Ideally, the concentration profiles should overlap identically to maximize the recombination of electrons and holes in the nitride layer. In reality, the charges do no overlap identically and residual charges of electrons build up in the region of nitride layer 101 between left bit 210 and right bit 211.

Figure 3:
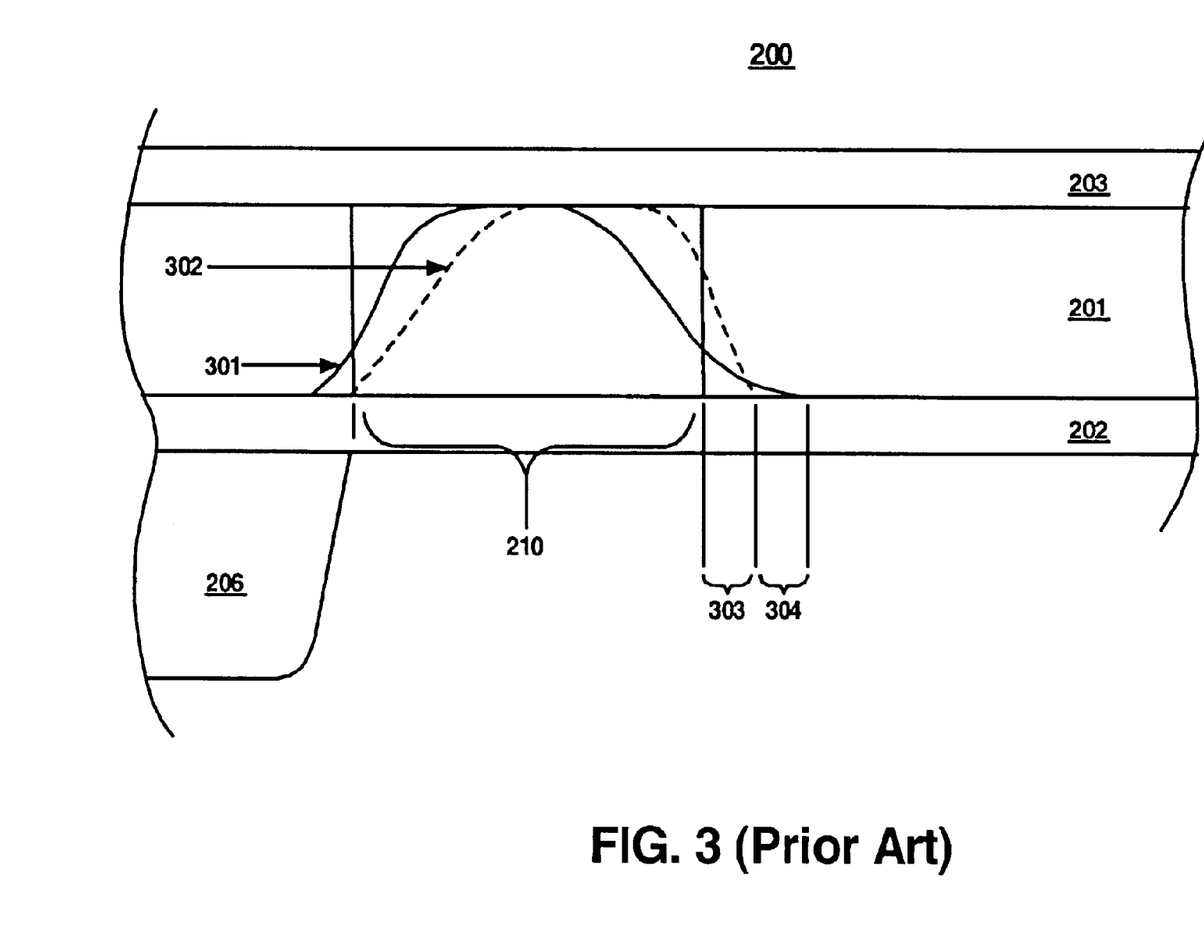
FIG. 3 shows an exemplary distribution of electrons and holes in a prior art nitride read only memory device.

FIG. 3 shows an exemplary distribution of electrons and holes in a prior art nitride read only memory device. Electron distribution 301 shows the concentration profile of electrons within nitride layer 201. Hole distribution 302 shows the concentration profile of holes within nitride layer 201. As shown in FIG. 3, the distribution of electrons is concentrated in the vicinity of the bitline/ONO junction (e.g., left bit 210). However, the concentration profile of hole distribution 302 does not overlap the concentration profile of electron distribution 301. This results in an area 303 within the channel region of nitride layer 201 with a greater concentration profile of holes and a second are 304 with a greater concentration profile of electrons. The net result therefore, is a build up of residual charges within the channel region.

Thus, prior art methods for erasing a nitride read only memory device fail to effectively remove charges from the channel region of the nitride layer. Additionally, prior art methods for erasing a nitride read only memory device (e.g., tunneling enhanced hot hole injection) can cause physical degradation of the oxide layer of the memory device.

SUMMARY OF THE INVENTION

Accordingly, a need exists for a method and system for erasing a nitride read only memory device, such as a Flash memory device, which reduces degradation of the oxide layer caused by hot hole injection. While meeting the above stated need, it is desirable to provide a method and system for erasing a nitride read only memory device which is more effective at removing residual charges in the channel region of the nitride layer. While meeting the above stated needs, it is desirable for a method and system for erasing a nitride read only memory device which is compatible with existing semiconductor fabrication processes and equipment.

The present invention is a method and system for erasing a nitride read only memory device. In one embodiment of the present invention, an isolated P-well is formed in a semiconductor substrate. A plurality of N-type impurity concentrations are formed in the isolated P-well and a nitride read only memory cell is fabricated between two of the N-type impurity concentrations. Finally, an electrical contact is coupled to the isolated P-well.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

DETAILED DESCRIPTION OF THE PREFERRED EMBODIMENT

Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

In embodiments of the present invention, an isolated P-well is formed in a semiconductor substrate and an NROM cell is fabricated upon the isolated P-well between two source/drain regions. An additional electrical contact is also coupled to the P-well. When erasing the memory device, a higher voltage (e.g., 20 volts) is applied which is split between the control gate of the memory cell and the electrical contact. For example, in one embodiment, a negative 10 volts is applied to the control gate of the memory cell, and a positive 10 volts is applied to the electrical contact. The isolated P-well conducts the positive 10 volts beneath the entire memory cell which facilitates erasing residual charges in the channel region of the memory cell. This is advantageous over prior art methods for erasing an NROM device in which the erase voltage was directed to the ONO/bitline junction. Using embodiments of the present invention, a higher erase voltage can be applied to the memory device without requiring expensive design changes for the periphery devices of the memory array. Furthermore, embodiments of the present invention do not rely upon hot hole injection to remove charges from the nitride layer of the NROM cell and instead utilize a Fowler-Nordheim tunneling erase mechanism to remove charge from the nitride layer. This promotes device longevity because hot hole injection can cause degradation of portions of the memory cell. Embodiments of the present invention can be utilized in sector programmable flash memory arrays which simultaneously erase both bits stored in an NROM memory device.

Figure 4:
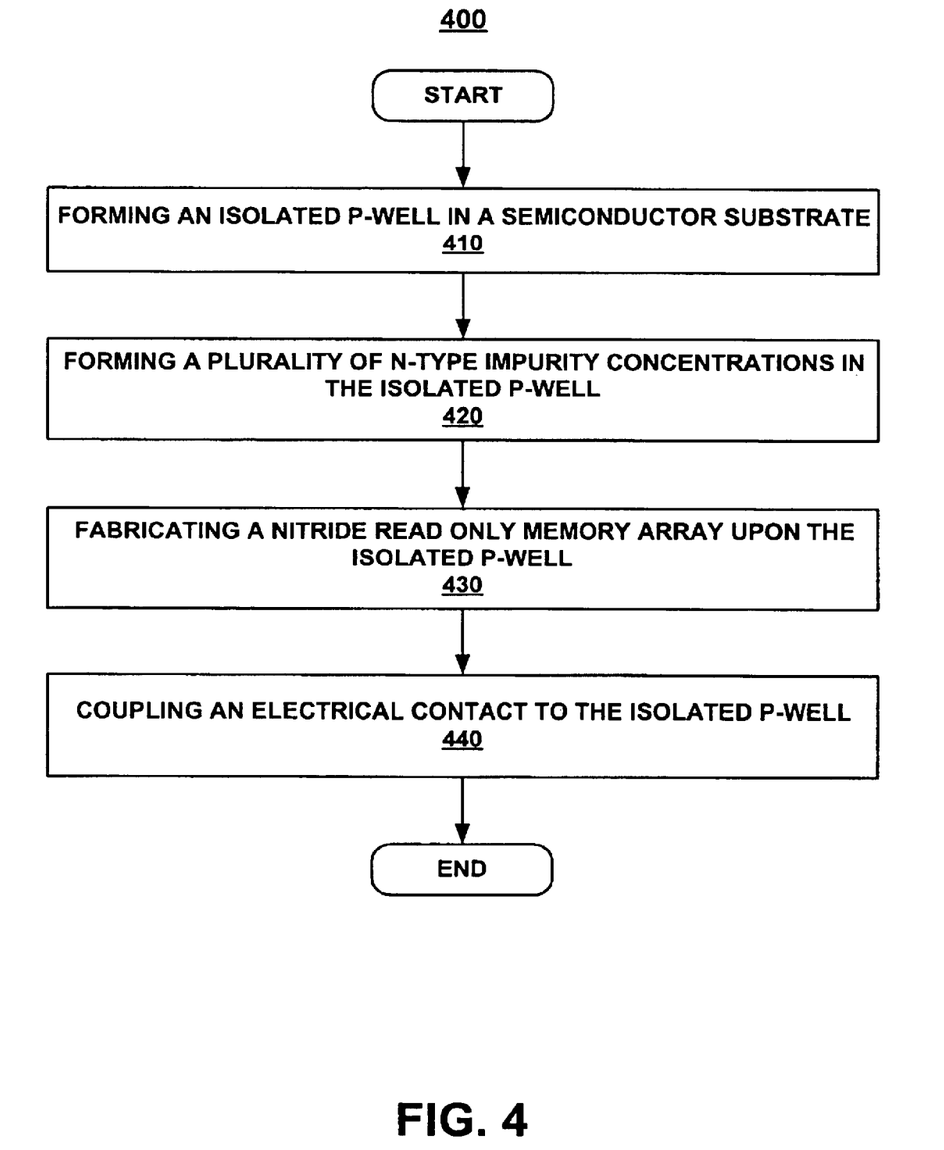
FIG. 4 is a flowchart of a method for fabricating a nitride read only memory device in accordance with embodiments of the present invention.

FIG. 4 is a flowchart of a method for fabricating a nitride read only memory device in accordance with embodiments of the present invention. Referring now to step 410 method 400 and to FIG. 5A, an isolated P-well is formed in a semiconductor substrate. In embodiments of the present invention, a P-well 510 is formed in semiconductor substrate 520. Substrate 520 is, in one embodiment, a lightly doped P-type substrate. In embodiments of the present invention, P-well 510 may have a slightly higher doping concentration than substrate 520 and is electrically isolated from substrate 520 by deep N-well 530 and side well 540.

Figure 5A:
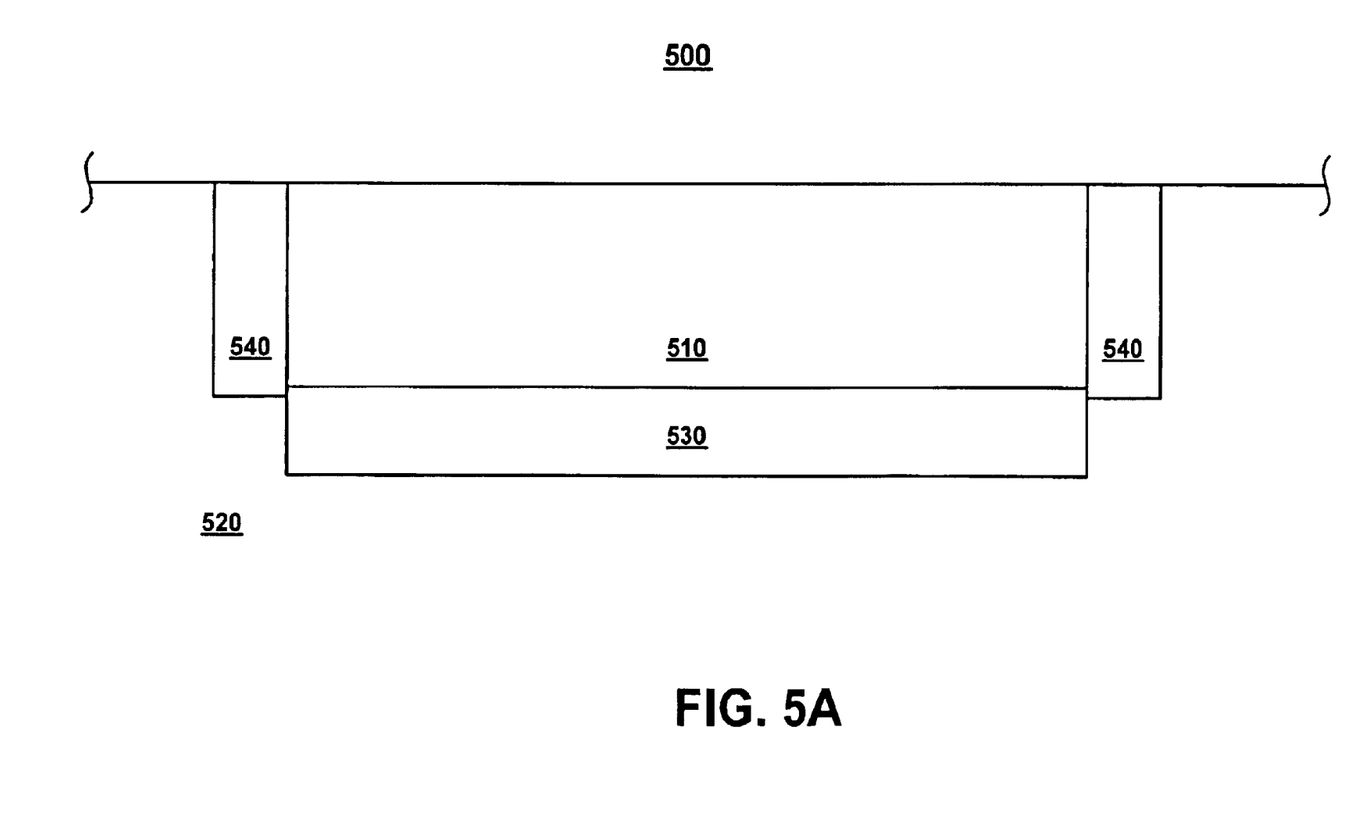
FIGS. 5A, 5B, 5C, and 5D are section views of a nitride read only memory device fabricated in accordance with embodiments of the present invention.

In one embodiment, fabricating the isolated P-well is accomplished by first depositing a deep N-well 530 which provides vertical isolation from substrate 520. In one embodiment, substrate 520 can first be doped N-type using, for example, phosphorus. Following a drive-in/anneal of the phosphorus to a depth in the range of 4–5 $\mu$m, substrate 520 may be doped P-type in the area overlying deep N-well 530. For example, a boron implant may be performed to create P-well 510 in the area of substrate 520 overlying deep N-well 530. A second drive-in/anneal may be performed to implant the boron to a depth in the range of 2–3 $\mu$m. While the present embodiment recites these specific material and process parameters, the present invention is well suited for using a variety of materials and parameters in forming P-well 510.

In embodiments of the present invention, side well 540 is an N-type well which is deposited in the area surrounding P-well 510 to provide lateral electrical isolation. While FIG. 5A shows side well 540 on two sides of P-well 510, it is appreciated that in embodiments of the present invention, side well 540 extends around the periphery of P-well 510. In one embodiment of the present invention, side well 540 is created in a subsequent mask and deposition step. However, side well 540 is shown in step 5A in order to more clearly define an isolated P-well. In embodiments of the present invention, side well 540 is created using, for example, phosphorus. In embodiments of the present invention, side well 540 may comprise a plurality of N-type well which surround P-well 510 and provide lateral electrical isolation.

Figure 5B:
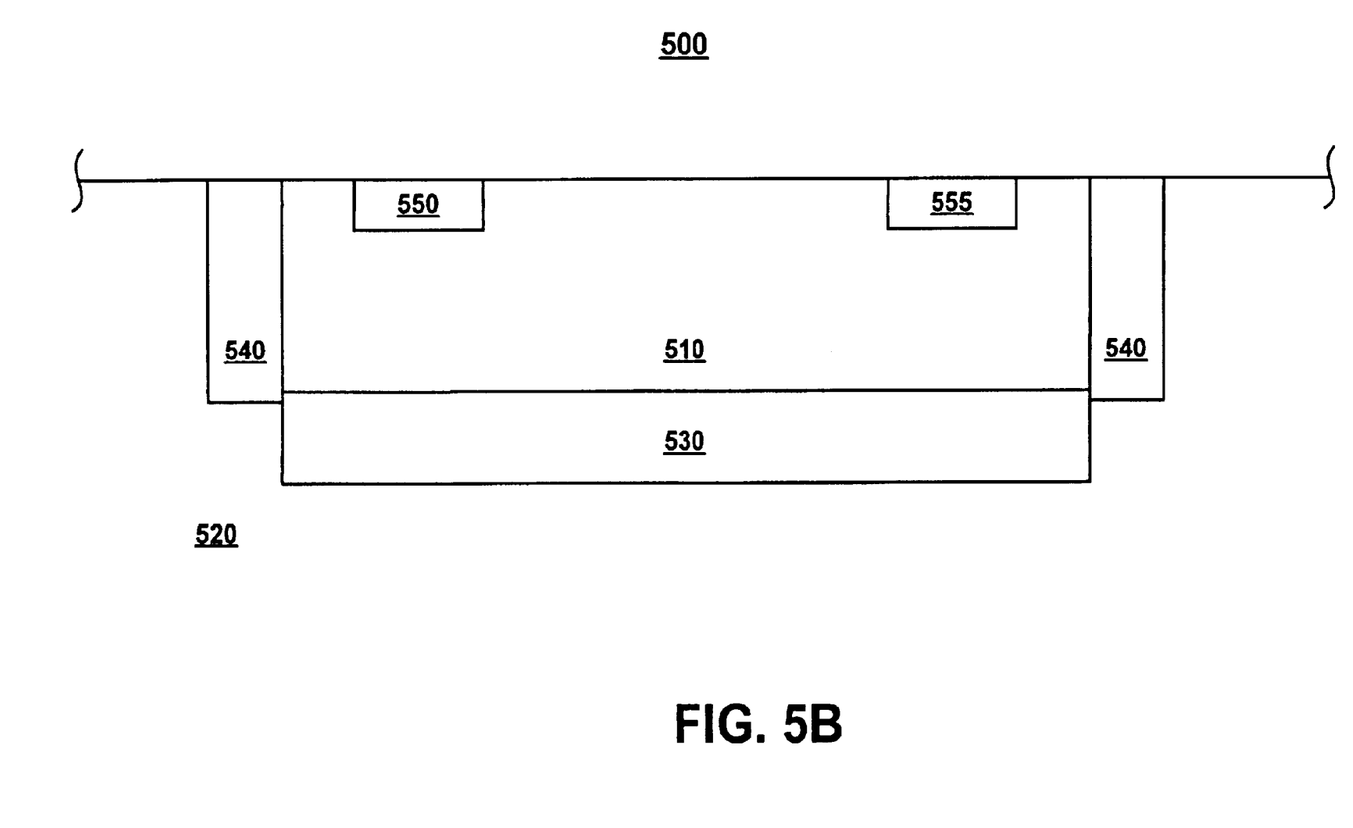

In step 420 of method 400, a plurality of N-type impurity concentrations are formed in the isolated P-well. Referring now to FIG. 5B, impurity concentrations 550 and 555 are formed in P-well 510. In one embodiment, arsenic is implanted or diffused to form N-type impurity concentrations 550 and 555 within P-well 510. In embodiments of the present invention, impurity concentration 550 couples a column of similar nitride read only memory cells with a bitline, and impurity concentration 555 couples the same column of memory cells with a second bitline.

Figure 5C:
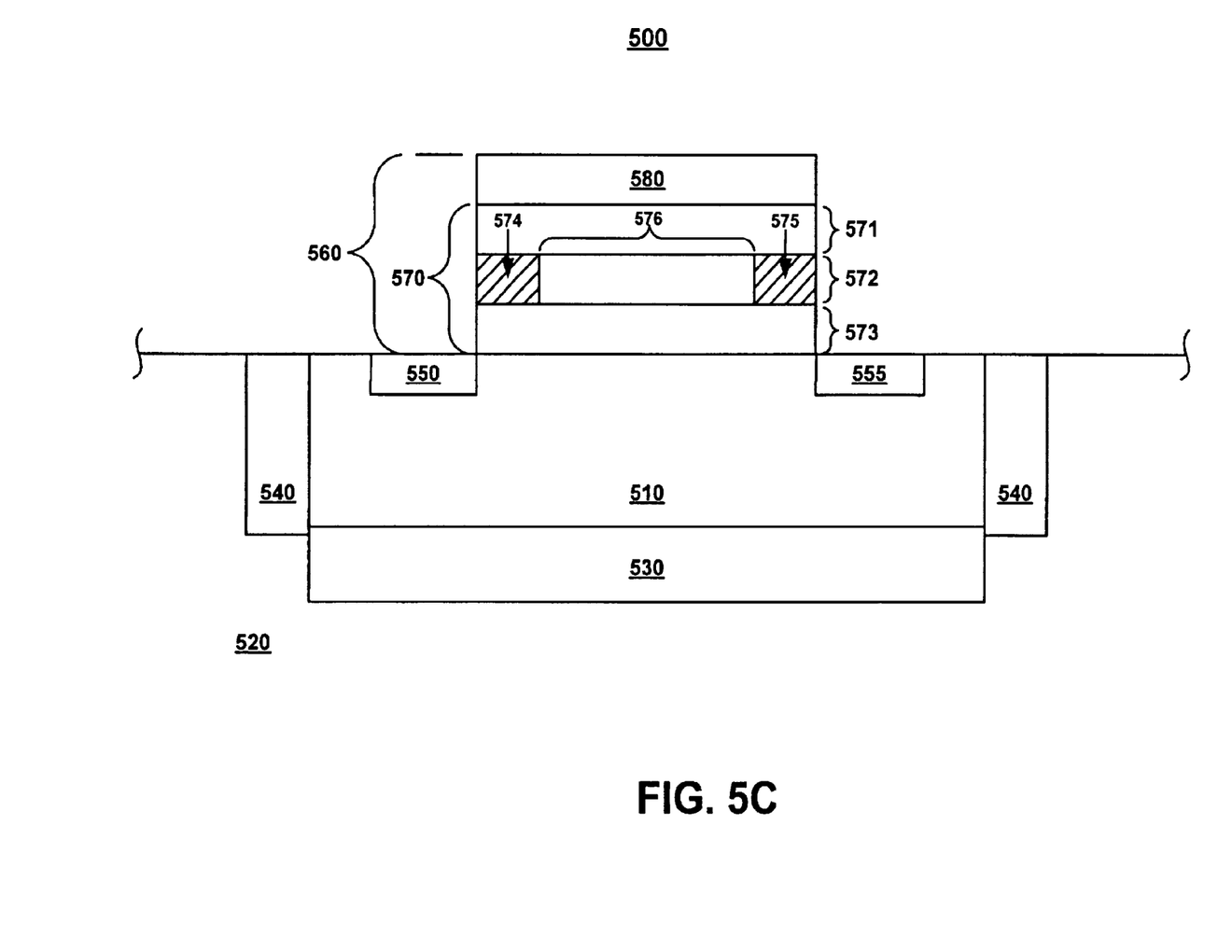
Figure 5D:
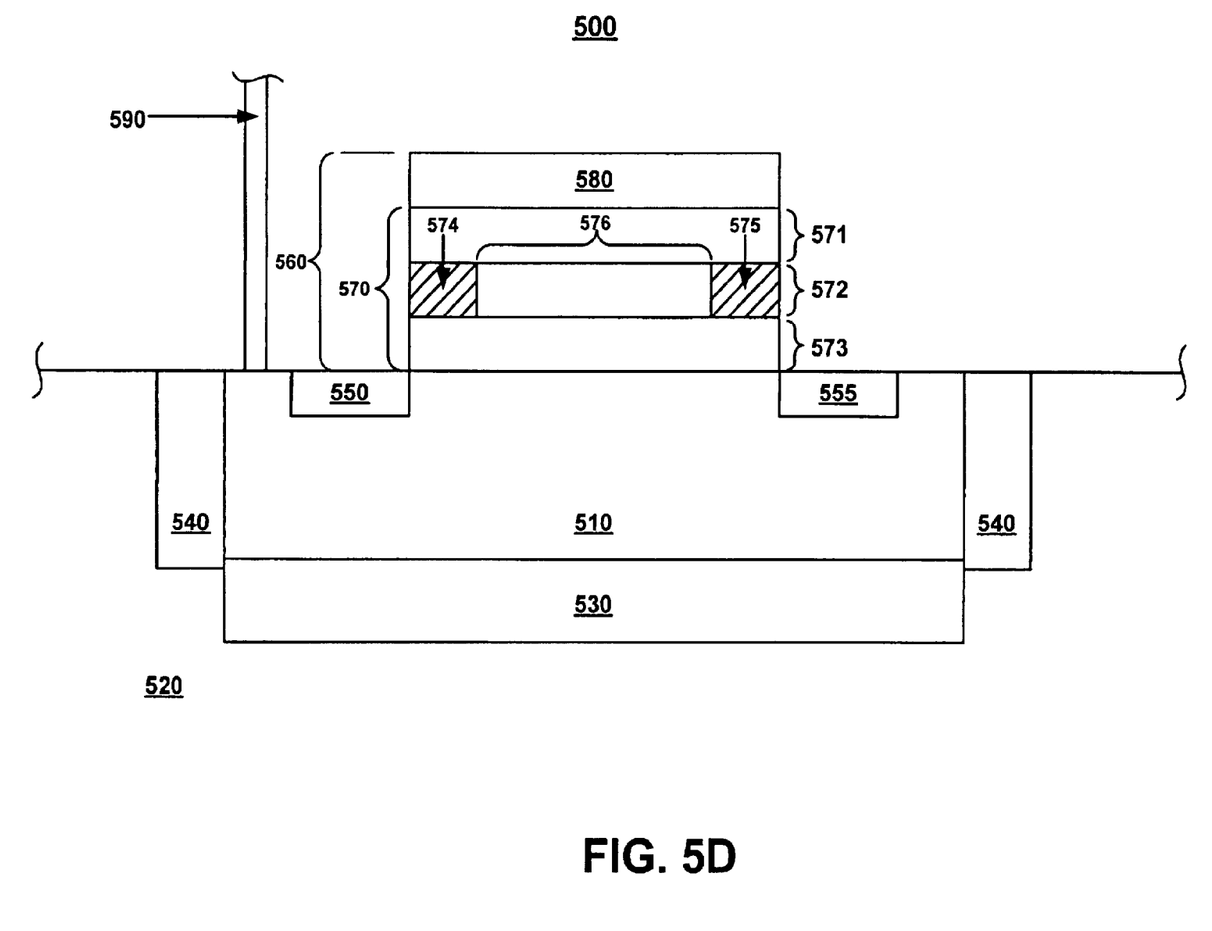

In step 430 of method 400, a nitride read only memory cell is fabricated upon the isolated P-well. Referring now to FIG. 5C, a nitride memory cell 560 is fabricated upon P-well 510. In embodiments of the present invention, memory cell 560 comprises an oxide nitride oxide layer (ONO) 570 disposed beneath a polysilicon layer 580. In embodiments of the present invention, ONO layer comprises a top oxide layer 571, a nitride layer 572, and a bottom oxide layer 573. In nitride layer 572, two bits of data are stored in regions 574 and 575 which are separated by a channel region 576. Polysilicon layer 580 is used as a control gate for memory device 500. In embodiments of the present invention, polysilicon layer 580 couples a row of similar nitride read only memory cells by a wordline. Furthermore, in embodiments of the present invention, top oxide layer 571 may be operable for preventing electron flow during erase operations. For example, top oxide layer 571 may have a slightly higher dielectric constant than bottom oxide layer 573. In step 440 of method 400, an electrical contact is coupled to the isolated P-well. Referring now to FIG. 5D, electrical contact 590 is coupled to P-well 510. In so doing, a nitride read only memory device 500 is created which comprises an isolated P-well, bitlines 550, nitride read only memory cell 560, and electrical contact 590. Prior art nitride read only memory devices lack the isolated P-well and electrical contact 590 of the present invention. In embodiments of the present invention, the isolated P-well and electrical contact 590 are used in order to more effectively erase the channel region 576 of ONO layer 570.

Figure 6:
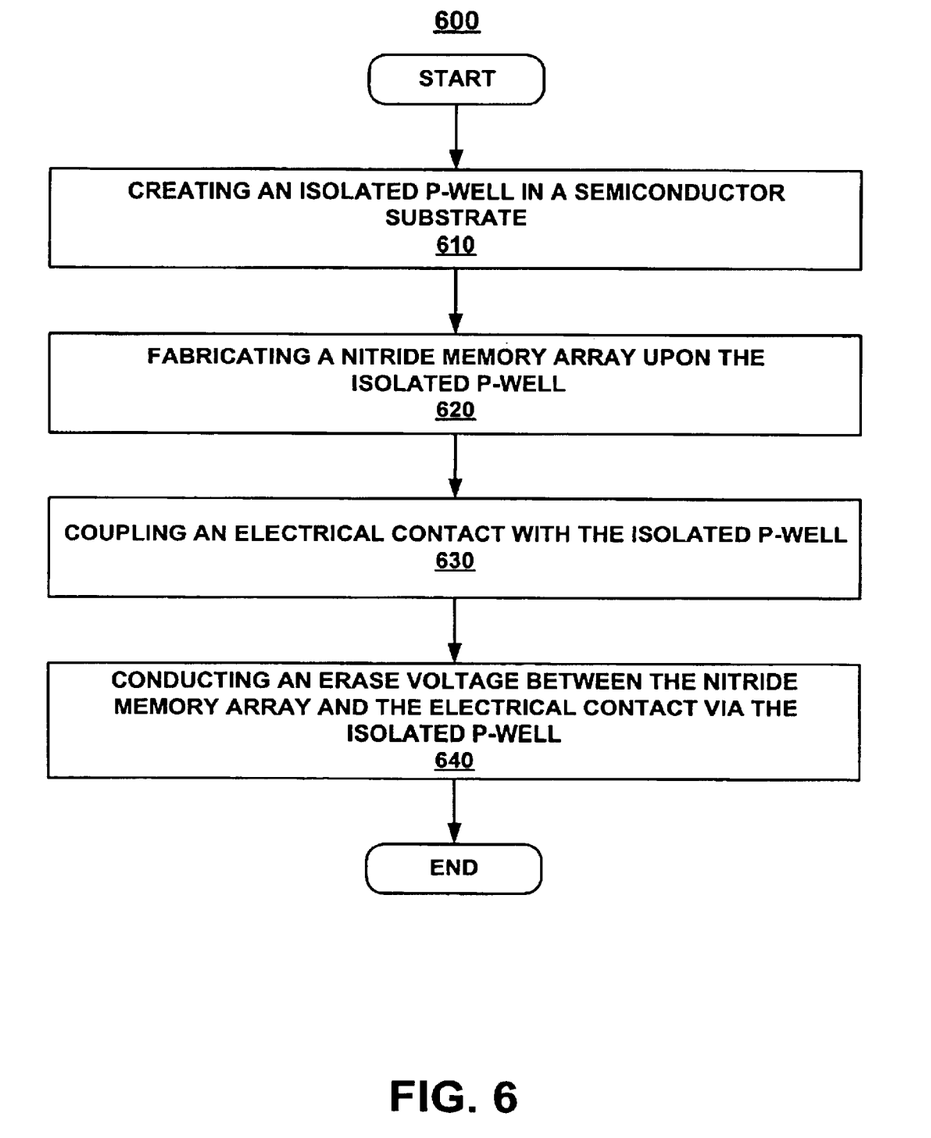
FIG. 6 is a flowchart of a method for erasing a nitride read only memory device in accordance with embodiments of the present invention.

FIG. 6 is a flowchart of a method for erasing a nitride read only memory device in accordance with embodiments of the present invention. Referring again to FIG. 5A and to step 610 of method 600, an isolated P-well is created in a semiconductor substrate. In embodiments of the present invention, the isolated P-well comprises a P-well 510 which is electrically isolated from substrate 520 by deep N-well 530 and side well 540.

Referring again to FIG. 5C and to step 620 method 600, a nitride read only memory cell is fabricated upon the isolated P-well. Memory cell 560 is disposed between impurity concentrations 550 and 555 which can be used as interchangeable source/drain regions of nitride read only memory device 500.

Referring again to FIG. 5D and to step 630 of method 600, an electrical contact is coupled with the isolated P-well. Electrical Contact 590 is used in embodiments of the present invention when erasing channel region 576.

In step 640 method 600, an erase voltage is conducted between the nitride read only memory cell and the electrical contact via the isolate P-well. In embodiments of the present invention, memory device 500 is erased by applying a negative voltage to the control gate (e.g., polysilicon layer 580 in FIG. 5) of memory device 500, and a positive voltage to electrical contact 590. In embodiments of the present invention, the source/drain regions 550 and 555 are grounded or are allowed to float. The voltage from electrical contact 590 is conducted via P-well 510 and is evenly distributed beneath memory cell 560. In embodiments of the present invention, when the erase voltages are applied to the control gate (e.g., polysilicon layer 580) and electrical contact 590, and electrical field is generated across ONO layer 570. Because top oxide layer 571 prevents electron flow in embodiments of the present invention, electrons are attracted out of nitride layer 572 toward P-well 510. Because the positive voltage is evenly distributed across P-well 510, residual charges (e.g., electrons) in channel region 576 are thus removed.

In prior art methods for erasing NROM memory devices, a voltage is applied to the control gate and the drain of the bit being erased. While this is sufficient for erasing the stored bit, it does not erase residual charges in the channel region of the nitride layer. Because the voltage is distributed evenly beneath the memory cell using P-well 510, the present invention is able to more effectively remove residual charges from the channel region of the nitride layer.

Prior art erase mechanisms rely upon hot hole injection, which is known to cause more degradation of the tunnel oxide layer (e.g., nitride layer 201 of FIG. 2). However, embodiments of the present invention utilize a Fowler-Nordheim tunneling erase mechanism. As a result, improved device reliability is realized in embodiments of the present invention due to reduced nitride layer degradation.

Because the total erase voltage is split between the control gate and the isolated P-well, a higher erase voltage can be utilized with embodiments of the present invention without necessitating a significant redesign of the periphery components of the memory array. To achieve Fowler-Nordheim erase for NROM device 500 a high erase voltage (e.g., ~20V) across ONO 570 layer is required. Without isolated P-well 510 to split the voltage, more complicated periphery circuitry is needed. In embodiments of the present invention, the 20 volts can be split between the control gate and isolated P-well so that, for example, −10 volts are applied at the control gate (e.g., polysilicon layer and +10 volts are applied at electrical contact The preferred embodiment of the present invention, a method and system for erasing a nitride read only memory device, is thus described. While the present invention has been described in particular embodiments, it should be appreciated that the present invention should not be construed as limited by such embodiments, but rather construed according to the following claims.

What is claimed is:

1. A method for erasing a memory device comprising:
    creating an isolated P-well in a semiconductor substrate, wherein said creating said isolated P-well comprises:
        creating a deep N-well using a first semiconductor fabrication process;
        creating a P-well disposed above said deep N-well using a second semiconductor fabrication process; and
        creating an N-type sidewell disposed around perimeter of said P-well and perimeter of said deep N-well using a third semiconductor fabrication process;
    fabricating a dual-bit nitride memory cell upon said isolated P-well, wherein said dual bit nitride memory cell is disposed between two N-type impurity concentrations formed in said isolated P-well, and wherein said dual-bit nitride memory cell includes a bottom oxide layer, a nitride layer, and a top oxide layer having a higher dielectric constant than said bottom oxide layer;
    coupling an electrical contact to said isolated P-well; and
    conducting an erase voltage between said dual-bit nitride memory cell and said electrical contact via said isolated P-well.

2. The method for erasing a memory device as recited in claim 1, further comprising erasing a residual charge in said dual-bit memory cell using said erasing voltage.

3. The method for erasing a memory device as recited in claim 1, wherein said creating of said deep N-well comprises implanting arsenic in said semiconductor substrate to a depth of approximately 4 to 5 microns.

4. The method for erasing a memory device as recited in claim 1, wherein said creating of said P-well comprises implanting a dopant in said semiconductor substrate to a depth of approximately 2 to 3 microns.

5. The method for erasing a memory device as recited in claim 1, wherein said creating of said N-type sidewell comprises implanting arsenic in said semiconductor substrate to a depth of approximately 2 to 3 microns.

6. The method for erasing a memory device as recited in claim 1, wherein said dual-bit nitride memory cell further includes a control gate, wherein said conducting of said erase voltage comprises conducting a first voltage to said control gate and conducting a second voltage to said electrical contact.

7. The method for erasing a memory device as recited in claim 6, wherein said conducting of said first voltage comprises conducting a negative voltage to said control gate.

8. The method for erasing a memory device as recited in claim 6, wherein said conducting of said second voltage comprises conducting a positive voltage to said electrical contact.

* * * * *